United States Patent [19]

Ko et al.

[11] Patent Number: 5,227,322

[45] Date of Patent: Jul. 13, 1993

[54] METHOD FOR MANUFACTURING A HIGHLY INTEGRATED SEMICONDUCTOR DEVICE HAVING A CAPACITOR OF LARGE CAPACITANCE

[75] Inventors: Jae-hong Ko; Hee-seok Kim; Sung-tae Kim, all of Seoul, Rep. of Korea

[73] Assignee: Samsung Electronics Co., Ltd., Kyunggi, Rep. of Korea

[21] Appl. No.: 868,725

[22] Filed: Apr. 14, 1992

[30] Foreign Application Priority Data

Aug. 23, 1991 [KR] Rep. of Korea .................. 91-14631

[51] Int. Cl.$^5$ .................. H01L 21/265; H01L 21/70
[52] U.S. Cl. .................. 437/47; 437/52; 437/60; 437/228; 437/919
[58] Field of Search .................. 437/60, 52, 47, 919, 437/228; 357/23.6; 156/643, 645; 257/301–316; 365/149, 185

[56] References Cited

U.S. PATENT DOCUMENTS 5,068,199  11/1991  Sandhu .................. 437/52

FOREIGN PATENT DOCUMENTS 0404553  12/1990  European Pat. Off. .............. 437/60
61-03489   1/1986  Japan .................. 437/228
63-062370  3/1988  Japan .................. 437/52

OTHER PUBLICATIONS

Mine et al., "Capacitance-Enhanced Stacked-Capacitor with Engraved Storage Electrode for Deep Submicron DRAMs", Extended Abstracts of the 21st Conference on Solid State Devices and Materials, Tokyo, 1989, pp. 137–140.

Primary Examiner—Olik Chaudhuri
Assistant Examiner—Loc Q. Trinh
Attorney, Agent, or Firm—Morgan & Finnegan

[57] ABSTRACT

Disclosed is a method comprising forming a first electrode by forming a conductive layer on a semiconductor substrate, forming an etching mask on the conductive layer, etching the conductive layer and defining the conductive layer into cell units; and forming a dielectric film and a second electrode or the first electrode. Also disclosed is a method comprising forming a first electrode by forming a conductive structure on a semiconductor substrate, forming an etching mask on the conductive structure and etching the conductive structure; and forming a dielectric film and a second electrode on the first electrode. An insulating layer including pin holes such as a silicon nitride layer is formed on the conductive structure or the conductive layer; which is exposed under an oxidative atmosphere. The surface portion of the conductive structure or conductive layer is oxidized to form silicon oxide islands to be used as an etching mask. Since the method requires no specific process conditions, it is simple and extends the effective area of the cell capacitor, and is also applicable to various capacitor types.

34 Claims, 12 Drawing Sheets

METHOD FOR MANUFACTURING A HIGHLY INTEGRATED SEMICONDUCTOR DEVICE HAVING A CAPACITOR OF LARGE CAPACITANCE

BACKGROUND OF THE INVENTION

The present invention relates to a method for manufacturing a semiconductor device, and more particularly to a method for manufacturing a highly integrated semiconductor memory device having a capacitor of large capacitance by using as an etching mask silicon oxide island formed via the pin hole of an insulating layer.

Increase in cell capacitance improves the read-out capability and decreases the soft error rate in a DRAM memory cell, and therefore plays an important role in the improvement of cell memory characteristics. Due to the increase in packing density of memory cells, unit cell area per chip has decreased, which in turn reduces the area available for the cell capacitor. Therefore, the capacitance per unit area must be increased in tandem with increase in packing density.

Recently, many research reports have been published concerning increase in cell capacitance, most of them relating to the structure of the cell capacitor's storage electrode. For example, they include: the fin-structured electrode (3-Dimensional Stacked Capacitor Cell for 16M and 64M DRAMS by T. Ema et al., IEDM 1988, pp.592-595) of Fujitsu Co., the Box structured electrode (A New Stacked Capacitor Cell with Thin Box Structured Storage Node by S. lnoue et al., Extended Abstracts of the 21st Conference on Solid State Devices and Materials, 1989, pp.141-144) and SSC (Spread-Stacked Capacitor) Cell (A Spread-Stacked Capacitor (SSC) Cell for 64 Mbit DRAMs by S. Inoue et al., IEDM 1989, pp.31-34) of Toshiba Co., and the cylindrical electrode (Novel-Stacked Capacitor Cell for 64 Mb DRAMs by W. Wakamiya et al., VLSI Techology Symposium, 1989, pp.69-70) of Mitsubishi Co. However, attempts to increase cell capacitance by improving the structure of the storage electrode, have met with problems such as design rule limitations and a high error rate due to complicated processes. Accordingly such improved structure storage electrode is not practical in use. Therefore, in order to overcome the aforesaid problems, the need for a new manufacturing method for a cell capacitor increases further.

A method for increasing cell capacitance has been proposed which utilizes the physical properties of the storage electrode independent of the structural improvement of the storage electrode.

For example, the technique to enlarge the surface of a storage electrode by providing a polycrystalline silicon layer having an uneven surface is disclosed on pages 869 to 872 by Yoshio Hayashide, et al. and pages 873 to 876 by H. Watanabe et al., both of which were published in a literature entitled "Extended Abstracts of the 22nd on Solid State Device and Materials" in 1990.

According to the method of Watandbe et al., polycrystal silicon is deposited at 550° C. by a low-pressure CVD (Chemical Vapor Deposition) method. This specific temperature 550° C. corresponds to a transition temperature in which a film structure changes from an amorphous to a polycrystal structure.

The surface area of a polycrystalline silicon layer deposited at the above temperature is twice that deposited at other temperatures. The capacitor of a semiconductor device is formed by using the above-deposited polycrystalline silicon.

According to the above method, the capacitance is doubled by applying the above polycrystalline silicon layer to the storage electrode of a stack-type capacitor. Also, Hayaside et al. teaches that capacitance is increased to one and an half times when compared with a conventional polycrystalline silicon electrode, when forming a storage electrode by depositing polycrystalline silicon at 575° C.

Also, a capacitor cell having a storage electrode of in COB (Capacitor-Over-Bit line) structure with the above uneven surface is disclosed on pages 665 to 658 of IEDM (1990) in a paper entitled "A Capacitor Over-Bit Line (COB) Cell With a Hemispherical-Grain Storage Node for 64 Mb DRAMs" by M. Sakao, et al.

FIG. 1 is a layout used for manufacturing the COB cell described in the above paper.

The region designated by a laterally extending single-dotted line is a mask pattern P1 for forming an active region. The regions defined by solid lines and arranged symmetrically are a mask pattern P2 for forming gate electrodes. The doglegged region designated by long-dashed lines balancing around the center are a mask pattern P3 for forming local interconnections by which a source region is connected to a storage electrode. The region defined by a laterally extending double-dotted line which has a contact hole mark at its center, represents a mask pattern P4 for forming a bit line. The regions designated by short-dashed lines and filled with oblique lines are a mask pattern P5 for forming the storage electrode.

The COB cell is one where a cell capacitor is formed over a bit line, and its manufacturing process is as follows. After the bit line is formed to be connected to a drain region of a transistor, the bit line is electrically insulated by coating an insulating material on the whole surface of the substrate. Then, the insulating material is partially removed, thereby exposing a portion of the source region of a transistor. A storage electrode is formed on the insulating material, and is connected to the source region of the transistor through the exposed portion of the source region. This is suitable for 64 Mb and 256 Mb DRAM cells, and was introduced for preventing bit line contact failures.

FIGS. 2A to FIG. 2D are cross sectional views illustrating a method for manufacturing a highly integrated semiconductor device according to the conventional method, which correspond to a sectional view taken along line A—A' in FIG. 1.

The polycrystalline silicon with hemispherical-grain described in the above-mentioned paper (hereafter, referred to as "HSG polycrystalline silicon") is formed by means of physical phenomena, especially those occurring while amorphous silicon is transformed into polycrystalline silicon. When amorphous silicon is deposited on a semiconductor substrate and then heated, the amorphous silicon forms minute hemispherical-grains, under specific conditions: 550° C. at 1.0 torr. The amorphous silicon becomes polycrystalline silicon in an intermediate state having an uneven surface, which increases the surface area to two or three times that of a smooth surface.

An insulating layer 22 (strictly speaking, two or three interposed insulating layers) is formed over the whole surface of the semiconductor substrate, on which both a local interconnection 20 in contact with the source region of a transistor and a bit line in contact with the drain region, have been formed. Thereafter, a contact hole 9 is formed by anisotropic etching in order to expose a portion of the local interconnection. Then, the contact hole is completely filled with polycrystalline silicon which is formed to a predetermined thickness on the insulating layer. Finally, an etching process is performed, using the above mask pattern P5, whereby a core storage electrode 30 is formed per each cell unit (FIG. 2A).

An HSG polycrystalline silicon layer 32 is formed over the whole surface of the semiconductor substrate on which the core storage electrode 30 has been formed. This is formed by an ordinary CVD method (Low-Pressure Chemical Vapor Deposition), under specific conditions of temperature and pressure, i.e., at 550° C. and 1.0 torr. Because of the small hemispherical grains, the surface area of the HSG polycrystalline silicon layer is increased to roughly twice that of conventional polycrystalline silicon layers without the HSG. Here, since the HSG is about 80 nm in diameter, the HSG polycrystalline silicon layer should be at least 80 nm thick and narrower than half of the core storage electrode spacing (FIG. 2B).

The HSG polycrystalline silicon layer 32 is etched back by an RIE (Reactive Ion Etching) method, using HBr gas without any etching masks. This is carried out until portions of the surface of insulating layer 22 between each core storage electrode 30 are exposed to define the storage electrode by cell units. At this step, the HSG polycrystalline silicon layer coated on the upper surface of the core storage electrode is completely removed and its uneven surface is transmitted to the surface of the core storage electrode. The HSG polycrystalline silicon 32a coated on the side surfaces of the core storage electrode is somewhat smoothed. The storage electrode is constituted by the core storage electrode 30a having the uneven surface and the HSG polycrystalline silicon layer 32a remaining after the etching process (FIG. 2C).

After a dielectric film 34 is formed on the whole surface of the storage electrode, a plate electrode 36 is formed by coating polycrystalline silicon on the whole surface of the semiconductor substrate, whereby the cell capacitor is completed (FIG. 2D).

In the above-described method for manufacturing a capacitor of a memory cell, the physical properties of the material are used, independent of the structural improvement of the storage electrode, to extend the effective area of the cell capacitor. Therefore, a cell capacitor is manufactured by a simplified process free from design rule. However, the required process conditions, such as the specific temperature and pressure, demand that the margin of error during processing becomes overly narrow. Moreover, its increase of effective capacitance per unit area is limited to approximately two times that of previous methods.

SUMMARY OF THE INVENTION

The object of the present invention is to provide a method for manufacturing a highly integrated semiconductor device having a capacitor with a effective area of a cell capacitor in order to increase its capacitance without requiring any specific conditions.

To achieve the above object and other object of the present invention, the present invention provides a method for manufacturing a highly integrated semiconductor device having a capacitor of large capacitance comprising the steps of forming a first electrode by forming a conductive layer on a semiconductor substrate, forming an etching mask on the conductive layer, etching said conductive layer and defining said conductive layer by cell units; and forming a dielectric film and a second electrode on the first electrode.

Additionally, the present invention provides a method for manufacturing a capacitor of a highly integrated semiconductor device having a capacitor of large capacitance comprising the steps of forming a first electrode by forming a conductive structure on a semiconductor substrate, forming an etching mask on the conductive structure and etching the conductive structure and forming a dielectric film and a second electrode on the first electrode.

The conductive structure or the conductive layer may be composed of polycrystalline silicon implanted with an impurity.

The conductive layer may be formed, for example, by depositing poly crystalline silicone on a semiconductor substrate to form a polycrystalline silicon layer and then implanting an impurity thereinto.

The conductive structure may be formed in such a manner that polycrystalline silicon is deposited to form a polycrystalline silicon layer on the semiconductor substrate and an impurity is implanted thereinto and then a pattern thereof having a predetermined shape is formed by patterning via an ordinary lithography process.

The polycrystalline silicon is deposited by thermally decomposing silane (SiH$_4$) generally at a temperature of 580°–650° C. It is desirable to deposit the polycrystalline silicon by the LPCVD method, in view of uniformity, purity and economic aspects. After polycrystalline silicon is deposited to form a polycrystalline silicon layer, an impurity is implanted therein to form the conductive layer. Thereafter, if resist is coated on the conductive layer and the resist pattern is formed by an ordinary lithography process, a polycrystalline silicon pattern as the conductive structure, may be formed by an anisotropic-etching method using the resist pattern as an etching mask.

The conductive structure or the conductive layer may be formed on the inner surface of trench formed in a semiconductor substrate.

The conductive structure can be formed in a portion of the substrate of a single-crystalline silicon. For example, after forming a trench in the silicon substrate, an impurity is implanted on the inner surface portion of the trench to endow conductivity therein. The impurity-implanted portion of the inner surface of the trench may be used as a conductive structure of the present invention.

According to a preferred embodiment of the present invention, the etching mask is constituted by islands of silicon oxide.

The etching mask may be formed by forming, on the conductive structure or on the conductive layer, an insulating layer including pin holes, forming an etching mask in the pin holes, and then removing the insulating layer.

The insulating layer is preferably a silicon nitride layer. The pinholes are formed in the silicon nitride layer. In the present invention, it is desirable that depositing condition is set such that the pin hole density is reasonable.

The silicon nitride layer is formed, for example, by depositing silicon nitride by the LPCVD method using a SiCl$_2$H$_2$+NH$_3$ system at 700°-800° C. It is preferable that the thickness of the silicon nitride larger thus formed is 30 Å-500 Å.

An etching mask is formed by exposing the conductive structure or the conductive layer on which the silicon nitride layer is formed under an oxidative atmosphere and oxidizing the surface portion thereof.

Then, the silicon oxide islands, that is, an etching mask, are formed via pin holes of a silicon nitride layer. Additionally, the pin hole density of the silicon nitride layer is increased. That is, during an oxidizing process new pin holes or a crack in a silicon nitride layer is generated due to the consumption of the silicon nitride layer. As a result, more silicon oxide islands are formed than pin holes initially formed in the silicon nitride layer.

This phenomenon occurs remarkably when the conductive structure of the conductive layer is composed of polycrystalline silicon. The oxidizing process is preferably performed such that the process condition are varied in accordance with the thickness of the silicon nitride layer or the depositing condition, so that the silicon nitride layer obtains a predetermined silicon oxide island density.

If the thickness of the silicon nitride layer is thinner, it should be oxidized at a lower temperature and within a shorter period. The oxidization process is desirably performed in the presence of H$_2$O for 20-40 minutes at 800°-950° C. After the oxidization process, the silicon nitride layer is selectively etched away.

The conductive structure or the conductive layer is etched using the silicon oxide island as a mask. Then an etching mask may be removed after etching the conductive structure or the conductive layer using an etching mask. When the etching mask is the silicon oxide islands, the etching mask may be removed by using HF or buffered HF mixture.

After etching the conductive structure or the conductive layer, the conductive structure or the conductive layer may be coated with a conductive material. Or after defining the conductive layer by cell units, the first electrode may be coated with a conductive material. By coating the conductive structure, the conductive layer, or the first electrode with a conductive material, the unevenness of the surface thereof can be controlled. The conductive material is desirably an impurity-implanted polycrystalline silicon. The polycrystalline silicon is deposited by the aforementioned CVD method, and then an impurity is implanted. The thickness of the polycrystalline silicon layer thus obtained is preferably about 50 Å-500 Å.

Also, the first electrode may be formed by forming a nonconductive poly crystalline silicon pattern, etching the pattern, and then implanting an impurity thereinto to endow conductivity.

The conductive layer is defined into cell units by forming a photoresist pattern on the conductive layer and etching the conductive layer by anisotropically etching.

After forming the first electrode, a second electrode is formed by coating a dielectric film and a second conductive material on the first electrode.

The dielectric films available for the present invention are, for example, Ta$_2$O$_5$ film, NO film, ONO film, SiO$_2$ film and Si$_3$N$_4$ film.

The second electrode is formed using a polycrystalline silicon. That is, the poly crystalline silicon is deposited on the dielectric film and then ion-implanted to endow a conductivity thereinto to obtain the second electrode.

BRIEF DESCRIPTION OF THE DRAWINGS

These and other objects and many of the attendant advantages of this invention will be readily appreciated as the same becomes better understood by reference to the following detailed description when considered in connection with the accompanying drawings in which.

DESCRIPTION OF THE PREFERRED EMBODIMENTS

Figure 3:
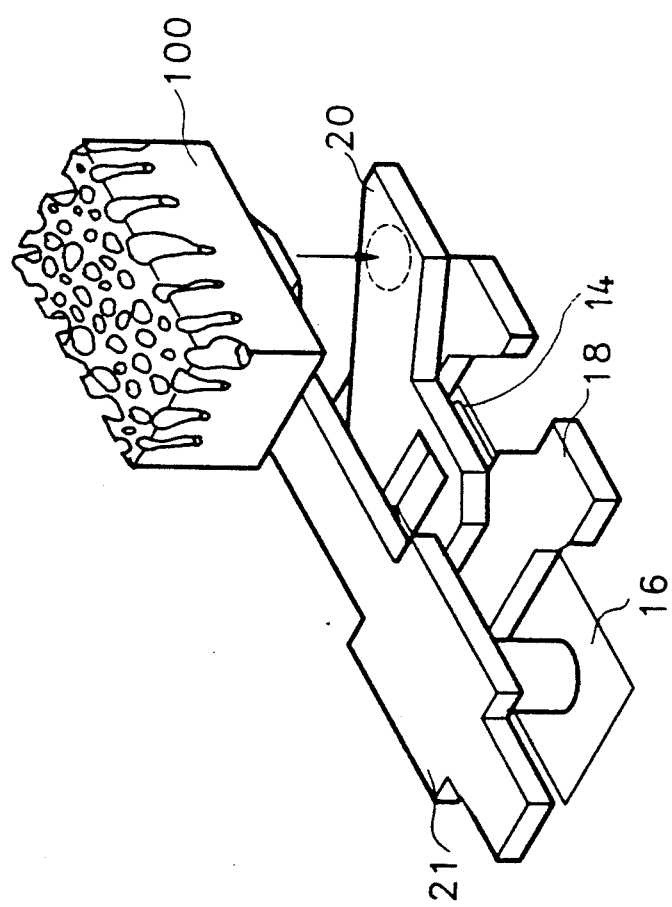
FIG. 3 is a perspective view of a highly integrated semiconductor device manufactured according to one embodiment of the present invention.

FIG. 3 is a perspective view of a highly integrated semiconductor device having a capacitor of large capacitance manufactured according to the present invention.

Figure 1:
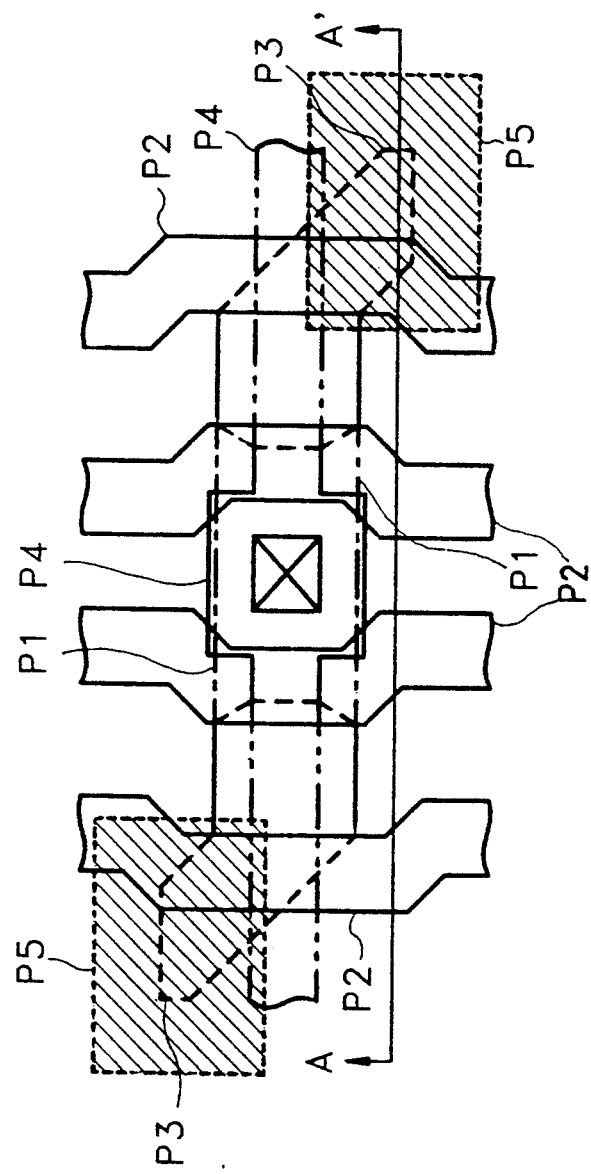
FIG. 1 is a layout of a COB cell for manufacturing a highly integrated semiconductor device.
Figure 2A:
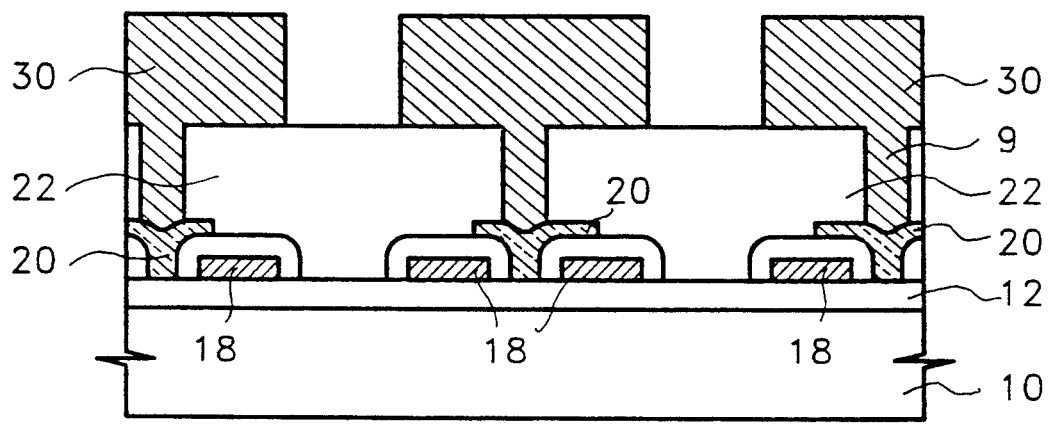
FIGS. 2A to 2D are sectional views showing a conventional method for manufacturing a highly integrated semiconductor device, which correspond to a sectional view taken along line A—A' in FIG. 1.
Figure 2B:
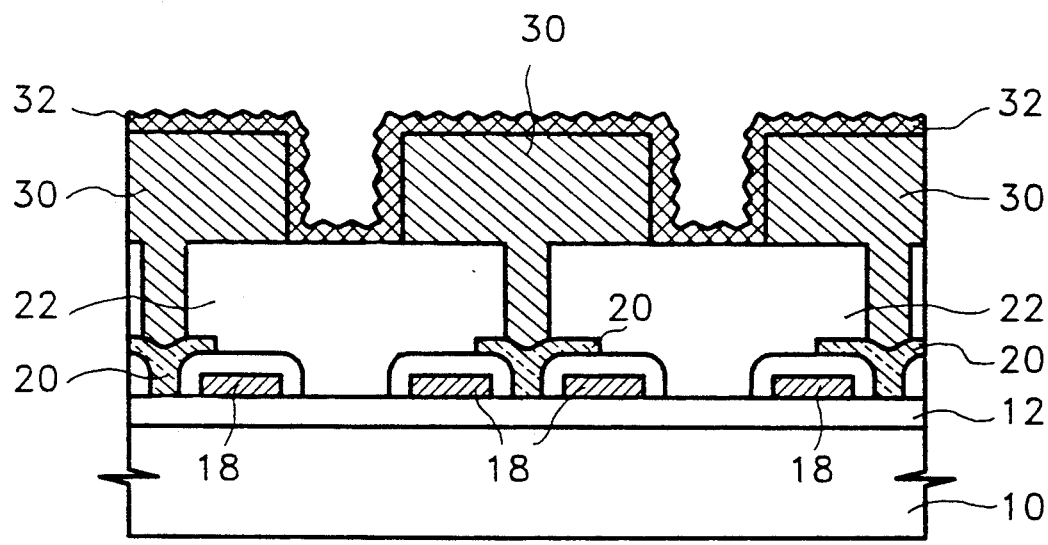
Figure 2C:
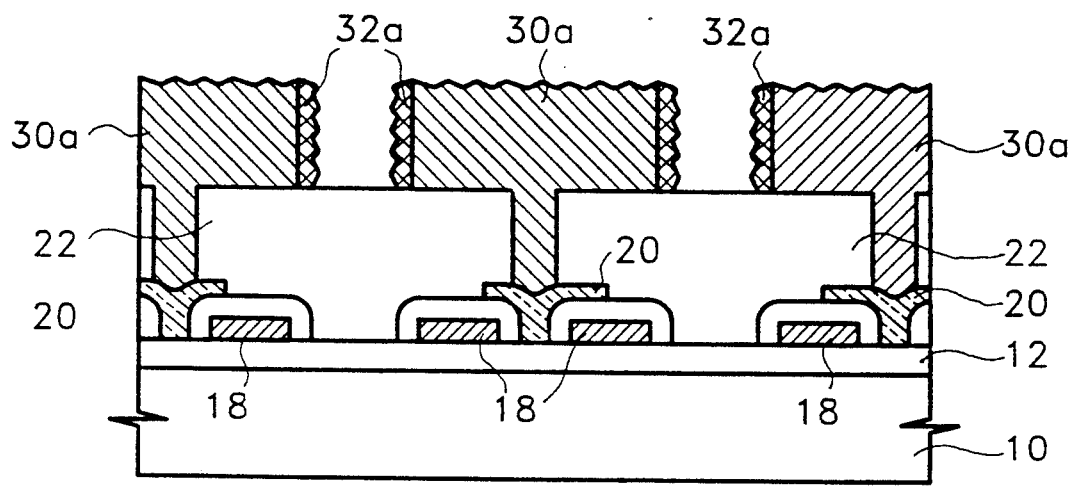
Figure 2D:
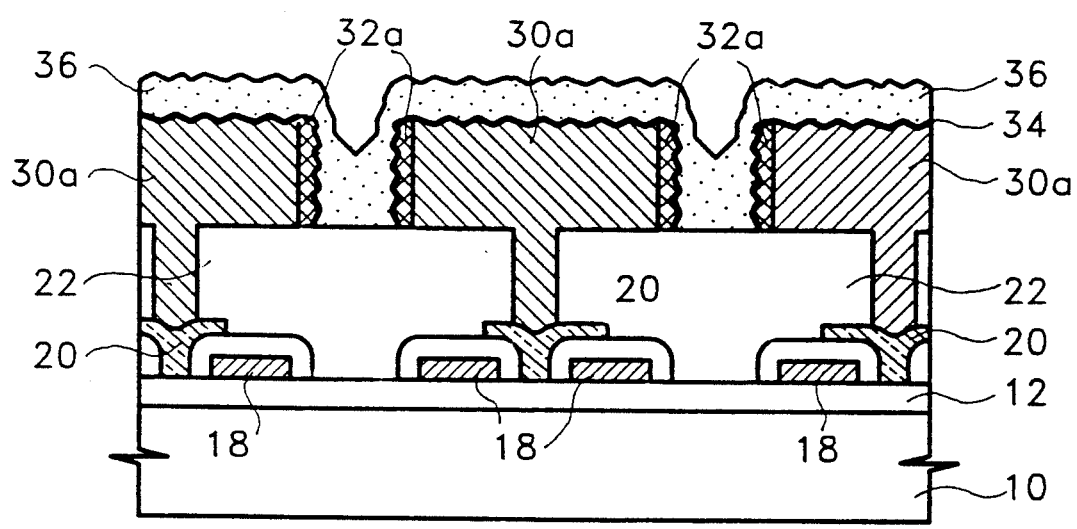

A highly integrated semiconductor memory device shown in FIG. 3 and manufactured using the mask patterns in FIG. 1 comprises a transistor consisting of a source region 14, a drain region 16 and a gate electrode 18; a local interconnection 20 for connecting the source region of the transistor to storage electrode 100; a bit line 21 connected to the drain region 16 of the transistor; and a storage electrode 100 manufactured according to the method of the present invention.

One embodiment of a method for manufacturing the highly integrated semiconductor memory device according to the present invention is described below with reference to FIGS. 4A through FIG. 4E.

Figure 4A:
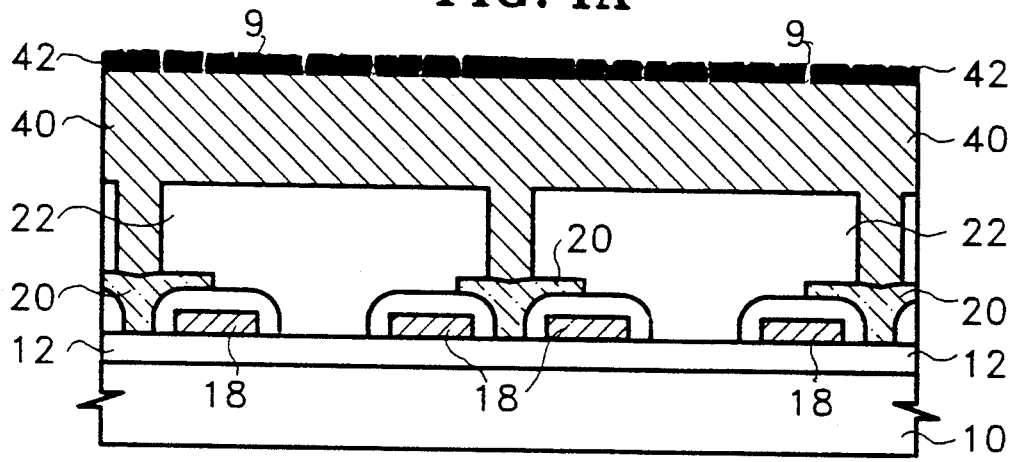
FIGS. 4A to 4E are sectional views showing the method for manufacturing a highly integrated semiconductor device according to an embodiment of the present invention, which correspond to a sectional view taken along line A—A' in FIG. 1.

FIG. 4A illustrates a process for forming a conductive layer 40 and a silicon nitride layer 42 serving as an insulation layer including pin holes. First, an insulating layer 22 (strictly speaking, two or three layers are stacked instead of just one layer) is formed on the whole surface of a semiconductor substrate on which both the local interconnection 20 in contact with the source region of the transistor, and the bit line in contact with the drain region, have been formed. Then, contact holes for exposing a portion of the local interconnection are formed by anisotropic etching. Successively, such a conductive material as a polycrystalline silicon implanted with an impurity, is deposited using an LPCVD method on the whole surface of the resultant structure having the contact holes, so that a conductive layer 40 is formed. Then, silicon nitride layer 42 is deposited on the conductive layer 40 to be 30 Å–500 Å thick. At this time, the thickness of the first conductive structure is an important factor to determine the final cell capacitance, and preferably, the thickness is about 4,000 Å–6,000 Å. Also, a silicon nitride layer having many pin holes 9 is preferable since it increases cell capacitance. The pin holes are naturally formed in the silicon nitride layer, but their number can be increased intentionally by controlling the conditions for depositing the silicon nitride layer.

The increase of cell capacitance as a main object of the present invention, is achieved effectively by the intentional increase of the pin holes.

Figure 4B:
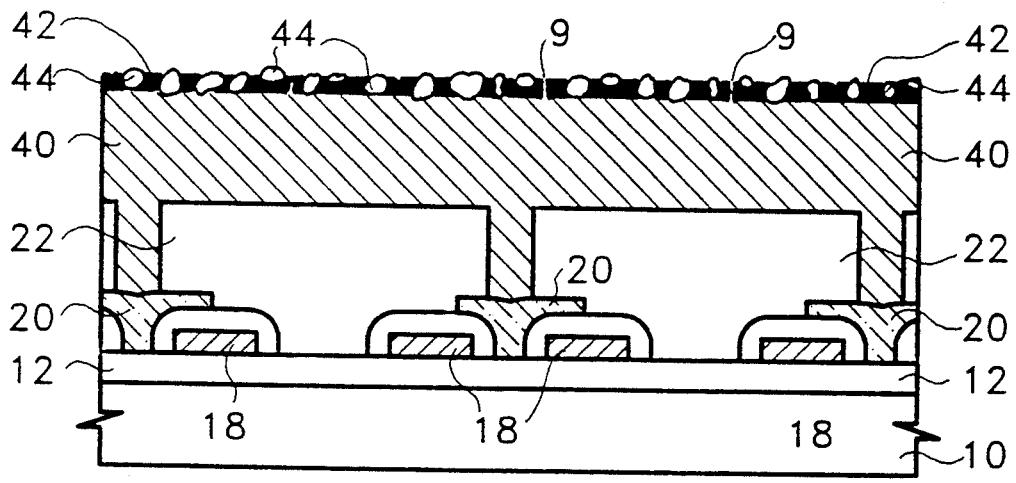

FIG. 4B illustrates the process of forming silicon oxide islands 44 serving as an etching mask via pin holes of the silicon nitride layer 42. If the conductive layer 40 on which the silicon nitride layer 42 having pin holes is formed, is exposed under an oxidative atmosphere such as an $O_2$ atmosphere and then the surface portion of the conductive layer 40 is oxidized, silicon oxide islands ($SiO_2$) 44 are formed in each pin hole or in a cracked portion of the silicon nitride layer. That is, the silicon oxide islands are formed to have any shapes and any number via the pinholes of the whole silicon nitride layer as if they form a group of islands.

The silicon atoms of the silicon nitride layer 42 or the surface portion of the conductive layer 40 composed of polycrystalline silicon and the oxygen atoms supplied from the $O_2$ atmosphere to the substrate ar combined to form silicon oxide islands 44 which are easily formed in a portion of the silicon nitride layer where the atomic bond is weak, for example, in a portion having a pin hole or a crack, to constitute a group of islands whose size are much smaller than the minimum feature size.

Another good places for forming silicon oxide islands 44 are provided in the silicon nitride layer 42 by other pin holes 9 or cracks generated during the above oxidation process, due to the loss of silicon atoms.

Figure 4C:
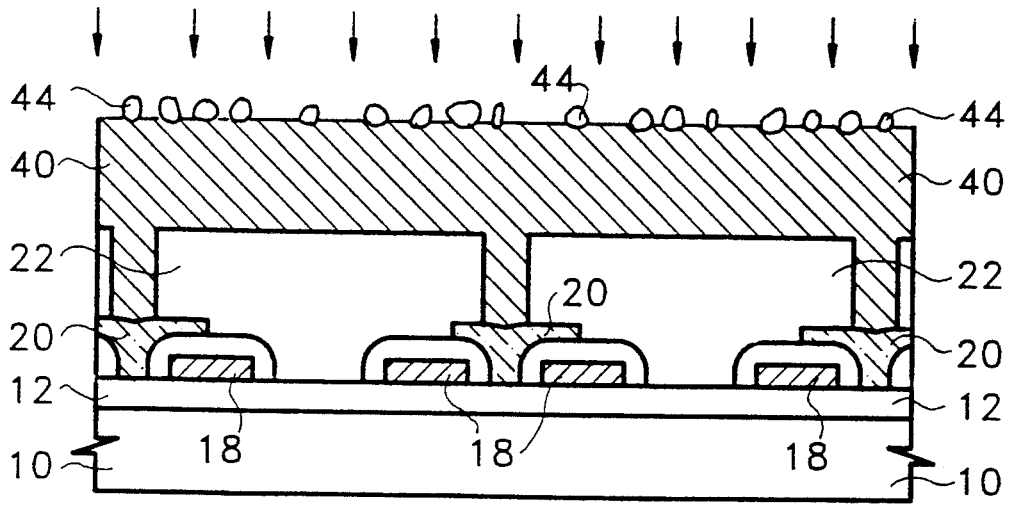

FIG. 4C illustrates an anisotropic-etching process using silicon oxide islands 44 as an etching mask. The resultant structure having silicon oxide islands formed as a group of islands throughout the whole silicon nitride layer is immersed into a wet-etching enchant for removing the silicon nitride layer, so that only silicon oxide islands 44 are left. Successively, using silicon oxide islands 44 as an etching mask, the conductive layer 40 is anisotropically etched to an arbitrary depth which is changed by controlling the etching time and the concentration of the enchant. Since this change plays an important role in altering cell capacitance, the above depth should be determined in accordance with the desired cell capacitance. Thereafter, the silicon oxide islands are removed by the use of HF or a buffered HF mixture.

Figure 4D:
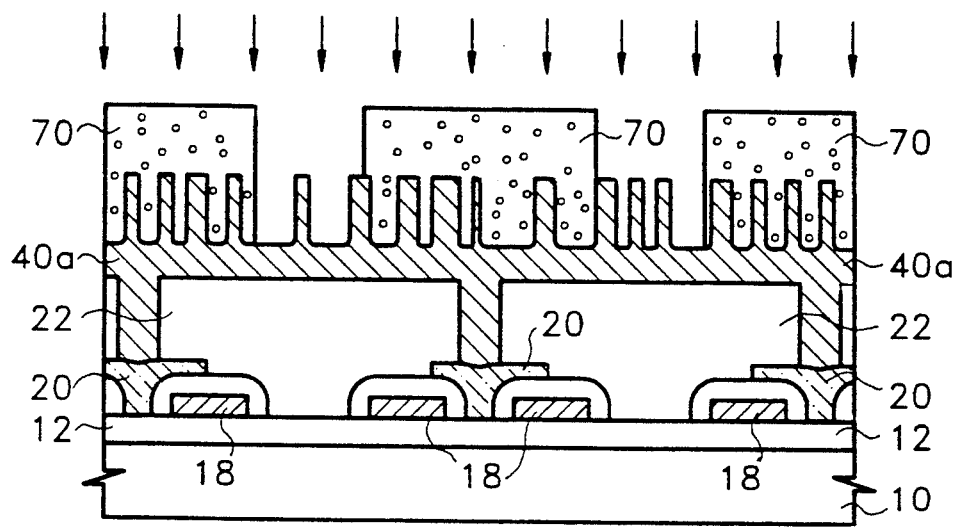

FIG. 4D illustrates a process for forming a storage electrode 100 as a first electrode defined by cell units. After the whole surface of the honeycomb-like conductive layer formed by the anisotropic etching is coated with a photoresist, a photoresist pattern 70 is formed using mask pattern P5. Then, the conductive layer is defined into cell units by anisotropical etching using the photoresist pattern as an etching mask, so that the cell-defined storage electrode 100 serving as a first electrode defined into cell units is completed.

Figure 4E:
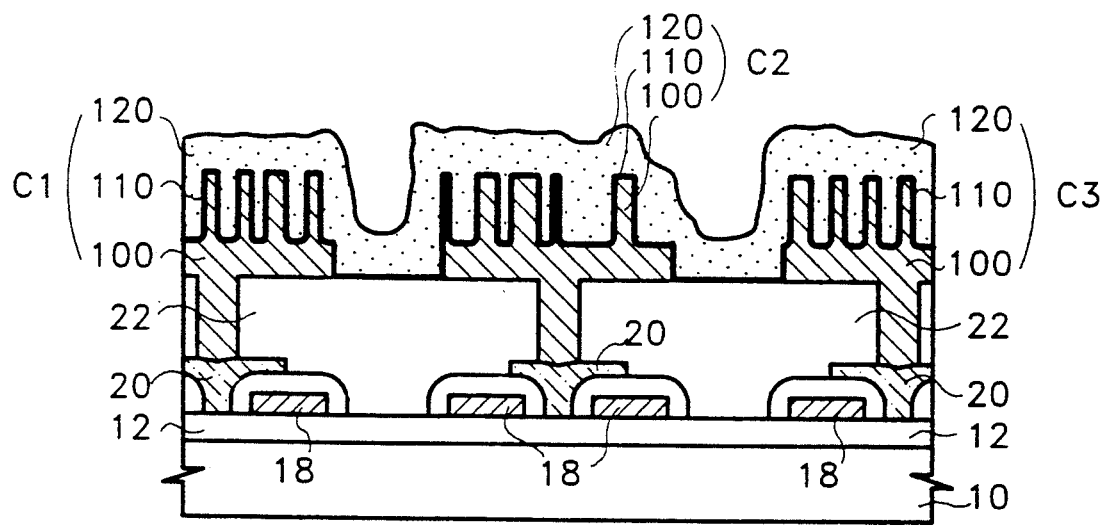

FIG. 4E illustrates a process for forming a dielectric film 110 and a plate electrode 120. A dielectric film 110 is formed on the whole surface of the semiconductor substrate on which storage electrode 100 has been formed by using a dielectric material having a high dielectric constant, e.g., tantalum oxide ($Ta_2O_5$). Thereafter, plate electrode 120 is formed on the whole surface of the dielectric film by depositing such a conductive material as a polycrystalline silicon where impurities have been doped, thereby completing a cell capacitor comprising storage electrode 100, dielectric film 110 and plate electrode 120.

Figure 5:
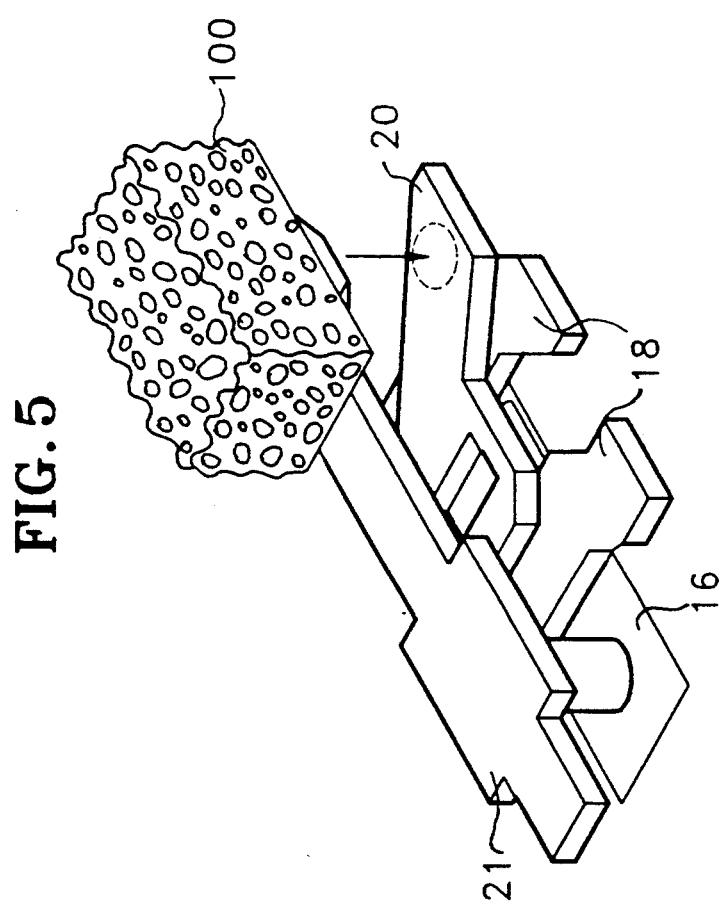
FIG. 5 is a perspective view of a highly integrated semiconductor device manufactured according to another embodiment of the present invention.

FIG. 5 is a perspective view of a highly integrated semiconductor device manufactured by another embodiment of the present invention. The structure is identical to that shown in FIG. 3, except for the shape of the storage electrode.

Referring to FIGS. 6A to 6E, another embodiment of a method for manufacturing a highly integrated semiconductor memory device according to the present invention will be explained.

Figure 6A:
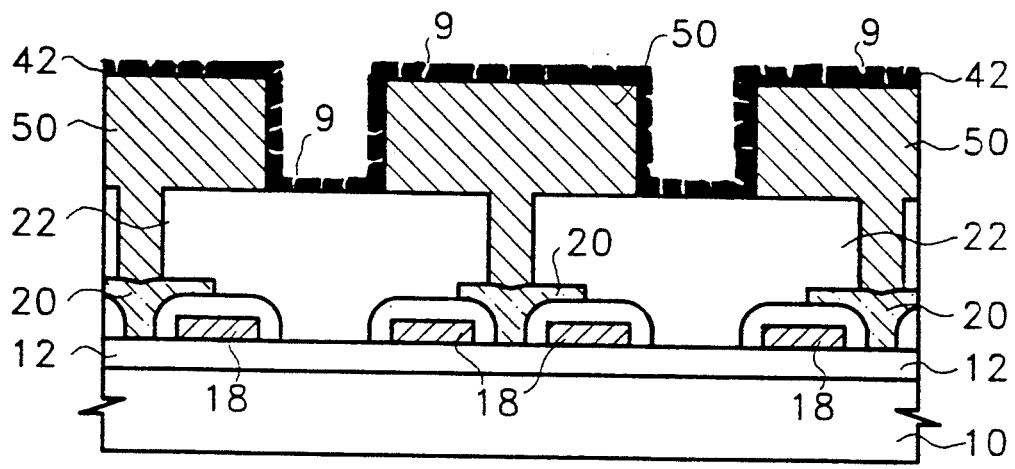
FIGS. 6A to 6E are sectional views showing the method for manufacturing a highly integrated semiconductor device according to another embodiment of the present invention, which correspond to a sectional view taken along line A—A' in FIG. 1.

FIG. 6A illustrates a process for forming a conductive structure 50 defined into cell units and a silicon nitride layer 42 serving as an insulating layer including pin holes. A conductive layer is formed by the similar method as the above-described one embodiment, then its pattern defined into cell units is formed to result in the conductive structure 50, using mask pattern P5. This is an alternative method to the above first embodiment in which the process is performed without patterning the conductive layer. Successively, silicon nitride layer 42 is formed on the whole surface of the resultant structure to a thickness of 30 Å–500 Å, and the silicon nitride film is the same as that in the aforementioned first embodiment.

Figure 6B:
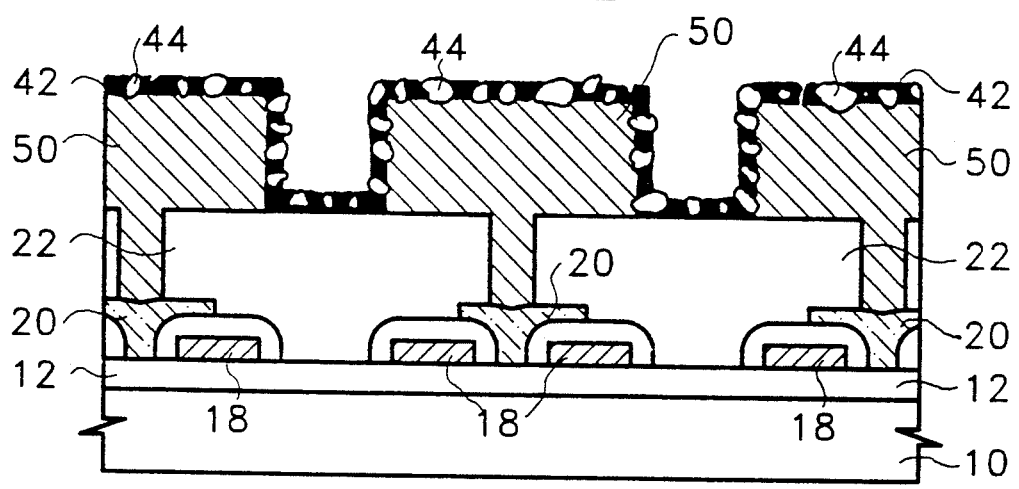

FIG. 6B illustrates the process of forming silicon oxide islands 44. If the conductive structure 50 having silicon nitride layer 42 formed thereon is exposed under an $O_2$ atmosphere and the surface portion of conductive structure 50 is oxidized, silicon oxide islands of any shape and number are formed throughout the whole nitride film as if they constitute a group of islands.

Figure 6C:
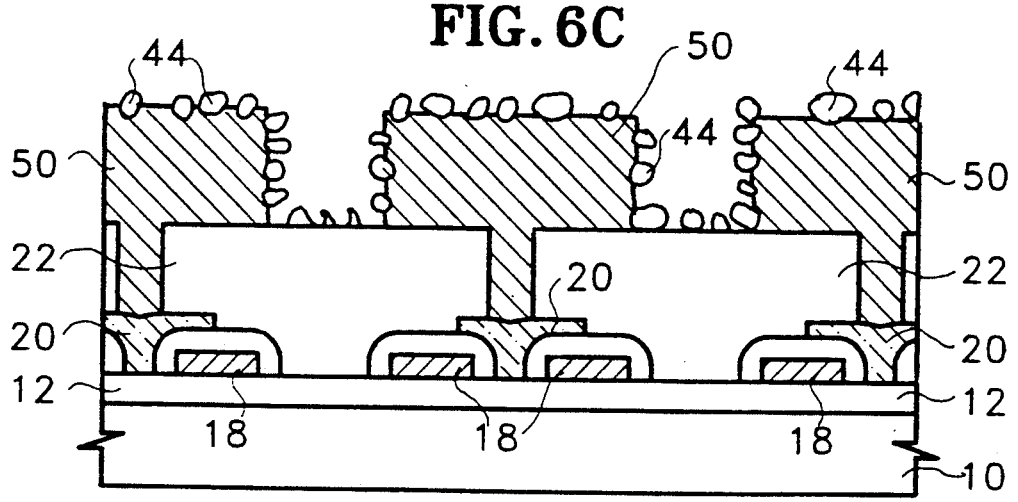

FIG. 6C illustrates the process of removing silicon nitride layer 42. The conductive structure 50 having silicon oxide islands 44 formed thereon is immersed in an enchant to remove silicon nitride layer 42, so that only silicon oxide islands 44 as an etching mask are left.

Figure 6D:
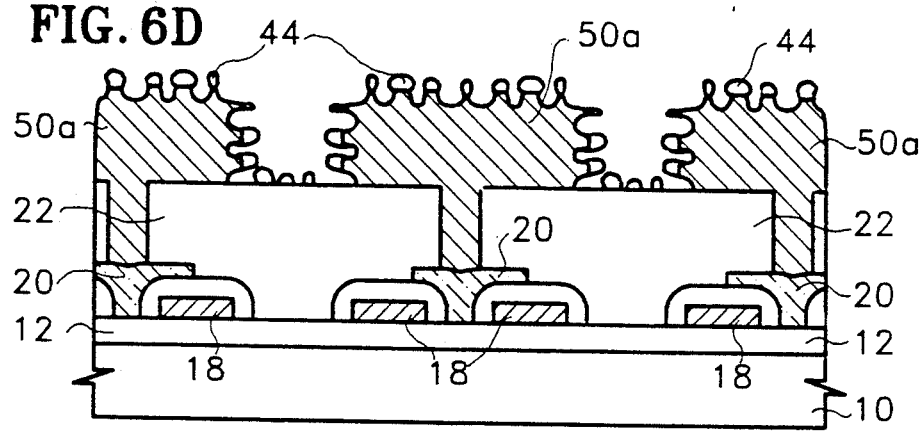

FIG. 6D illustrates the process of partially etching the conductive structure 50. If the conductive structure having silicon oxide islands formed thereon is isotopically etched, the surface portion of the conductive structure is partially removed to have a totally uneven surface. This is possible because the silicon oxide islands and the conductive structure have different etching rates with respect to the above isotropic etching. The isotropic etching can be performed by either wet etching or dry etching, and the degree of unevenness of the surface of the conductive structure 50 can be adjusted in accordance with the etching time and enchant concentration.

Also, in addition to the upper surface of the first conductive structure 50, the side surfaces thereof are etched by the isotropic etching, so its entire surface thus formed is similar to the conventional HSG polycrystalline silicon layer. The surface of the conventional HSG polycrystalline silicon layer is formed in the shape of a hemispherical cap, but that of the conductive structure is in the shape of a hemispherical cup. The conventional HSG polycrystalline silicon layer is formed by a special process under specific conditions on the whole surface of a core storage electrode, and an etching process is then performed again. That is, a process must be added in order to transmit the uneven surface to the core storage electrode. However, the process of the present invention is very simple just because the conductive structure 50 having silicon oxide islands 44 formed thereon is exposed to isotropic etching.

Figure 6E:
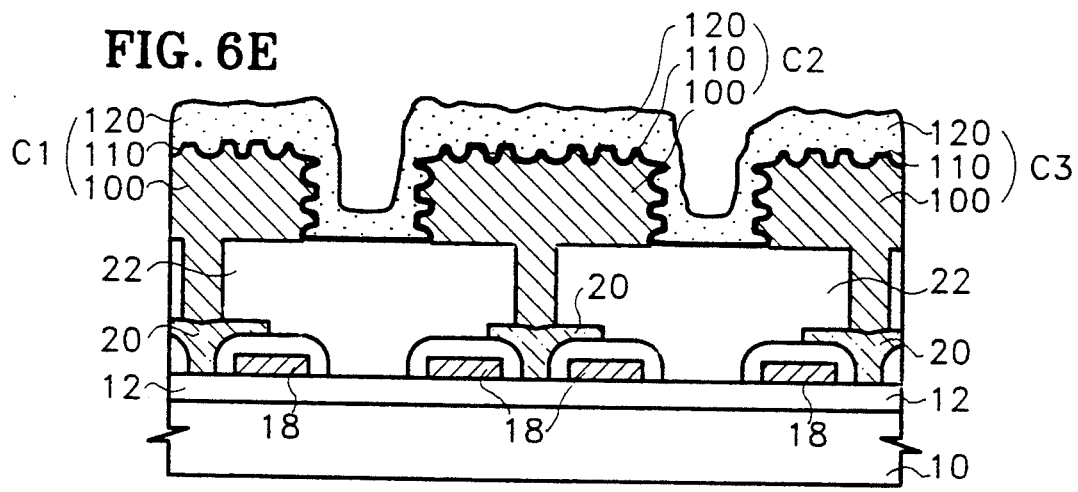

FIG. 6E illustrates a process for forming a dielectric film 110 and a plate electrode 120. After removing the silicon oxide islands 44 using HF or a buffered HF mixture to form the storage electrode 100, dielectric film 110 is formed on the whole surface of the semiconductor substrate on which the storage electrode 100 has been formed. Successively, such a conductive material as a polycrystalline silicon on which an impurity has been implanted, is deposited, thereby completing a cell capacitor including storage electrode 100, dielectric film 110 and plate electrode 120.

Figure 7:
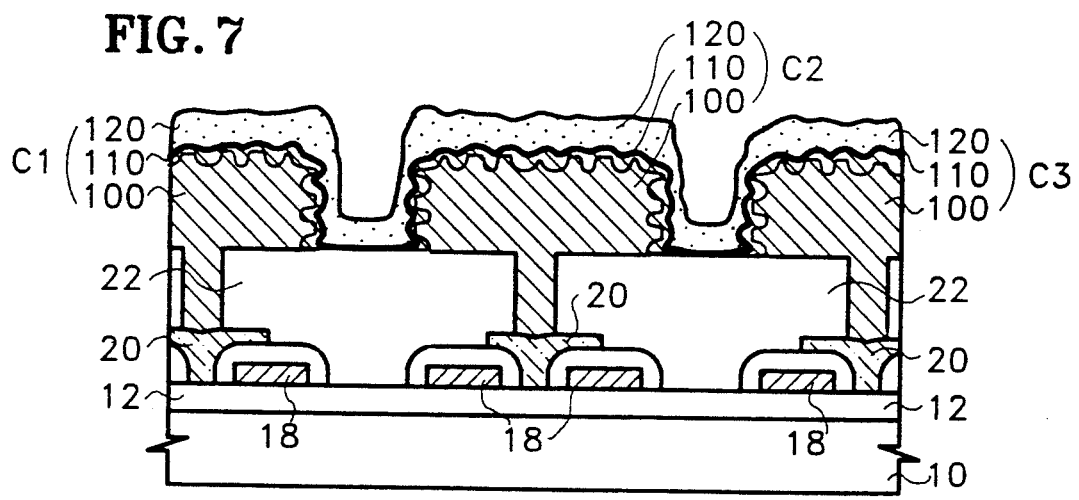
FIGS. 7, 8 and 9 are sectional views of other highly integrated semiconductor devices for illustrating other embodiments of the methods according to the present invention, which correspond to a sectional view taken along line A—A' in FIG. 1.
Figure 8:
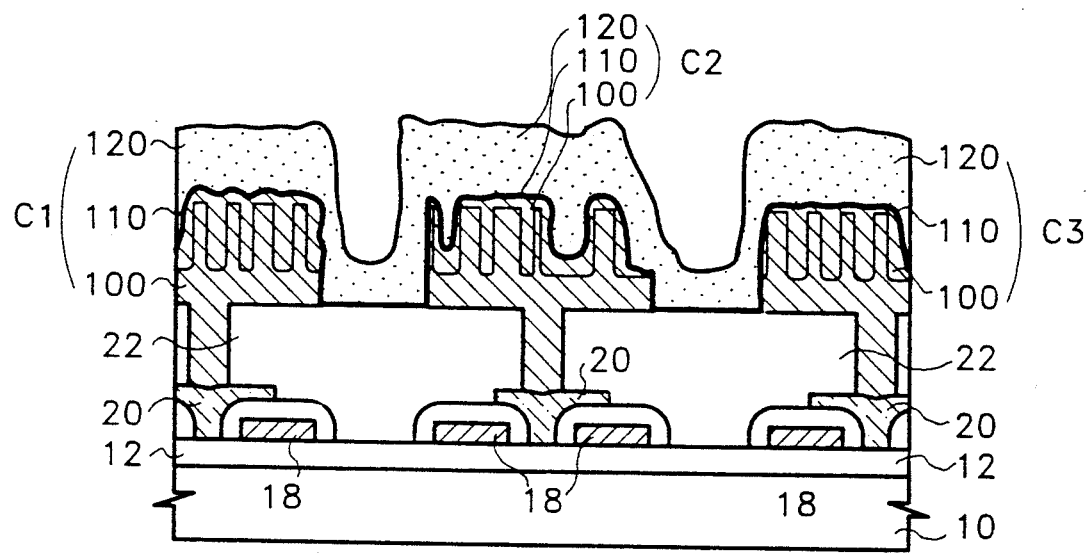
Figure 9:
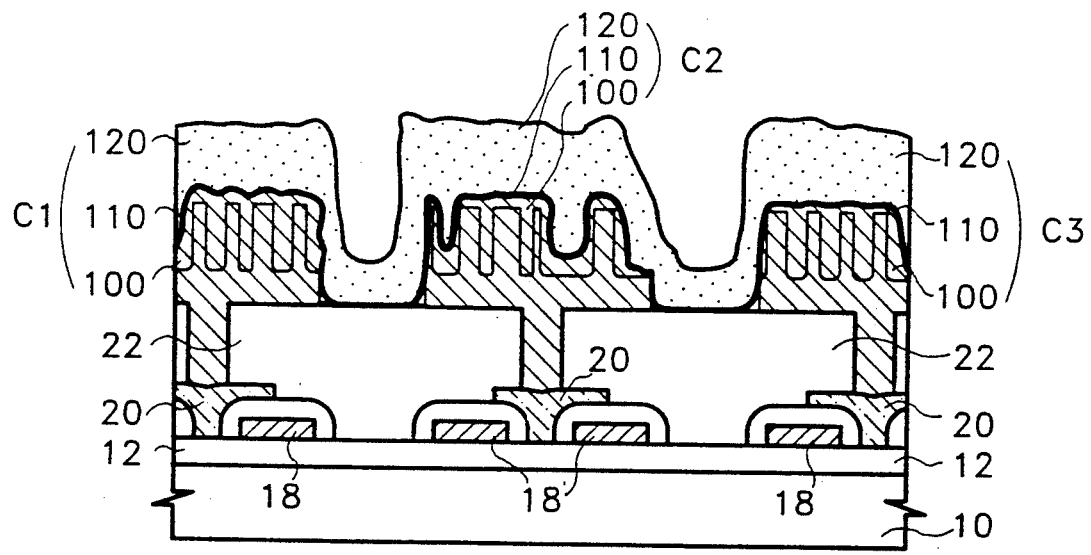
Figure 10:
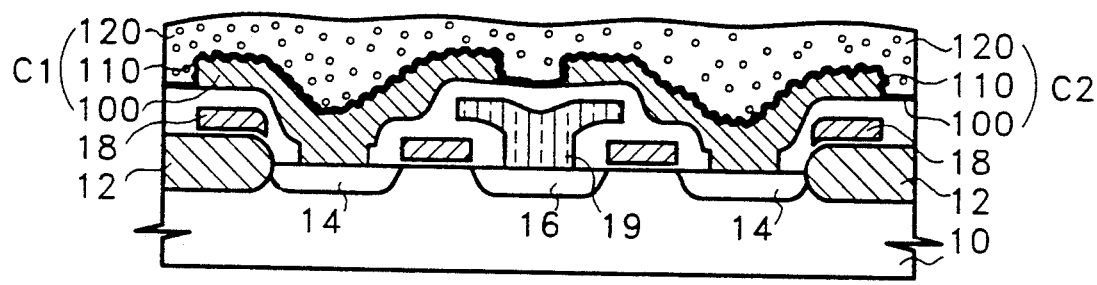
FIGS. 10 to 14 are sectional views of highly integrated semiconductor devices manufactured by the methods according to the present invention.
Figure 11:
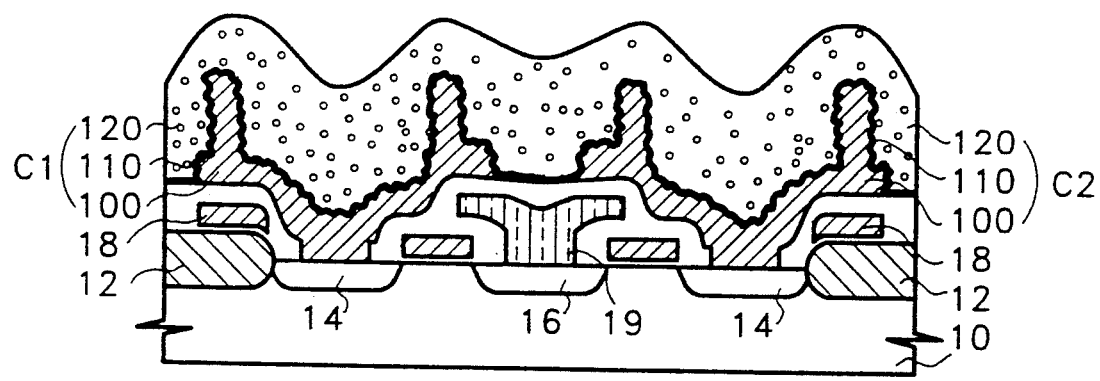
Figure 12:
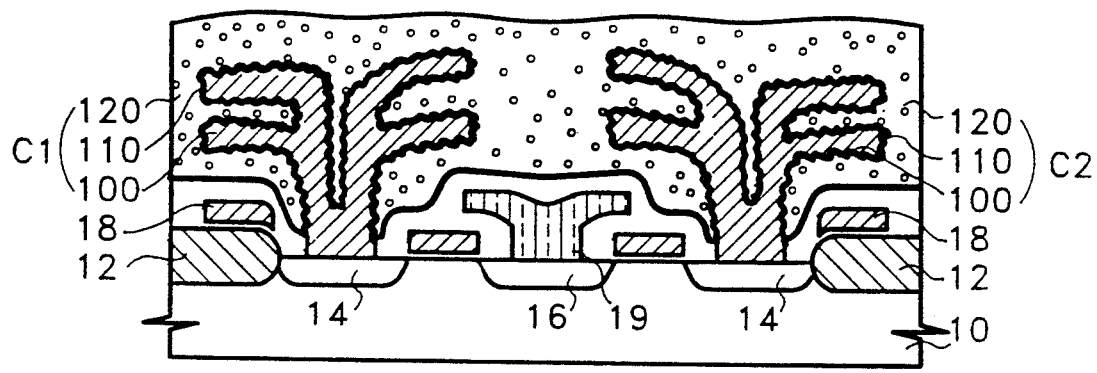
Figure 13:
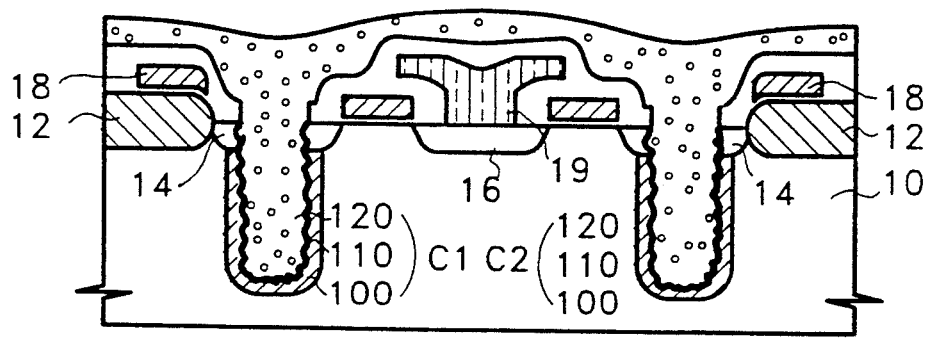
Figure 14:
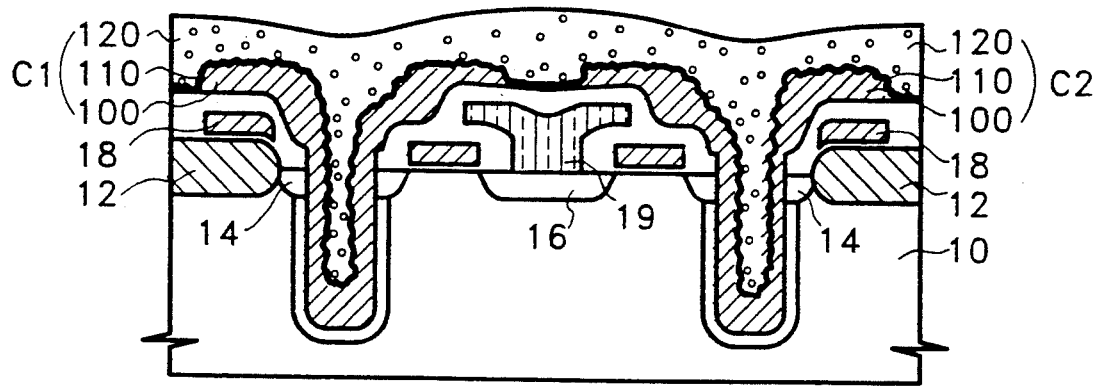

FIGS. 7 to 9 are sectional views of highly integrated semiconductor devices for illustrating other embodiments of the methods according to the present invention, which correspond to a sectional view taken along line A—A' of FIG. 1. A conductive material is deposited in a thickness of 50 Å–500 Å on the storage electrode formed by the aforementioned first and second embodiments. For example, a polycrystalline silicon layer implanted with impurities is additionally deposited, so that the roughness of the surface thereof is controlled. This is to reduce the unevenness of the surface of the storage electrode obtained by anisotropic or isotropic etching to prevent leakage current.

FIG. 7 shows a highly integrated semiconductor device obtained by depositing the conductive material and then patterning, after forming a first electrode by etching the conductive structure as mentioned in the step of FIG. 6D. FIG. 8 shows one obtained by depositing the conductive material before patterning into cell units and after partially etching the conductive layer as mentioned in the step of FIG. 4C. FIG. 9 shows one obtained by depositing the conductive material and their patterning after forming the first electrode by defining the conductive layer into cell units, as mentioned in the step of FIG. 4D.

FIGS. 10 to 14 are sectional views of highly integrated semiconductor memory devices manufactured by the methods according to the present invention. FIGS. 10 to 14 respectively show the semiconductor memory devices including a two-dimensional stacked capacitor, a cylindrical capacitor, a pin structured capacitor, a trench capacitor using as a conductive structure the inner surface portion of the trench formed in a single crystalline silicon substrate, and a stacked-trench capacitor.

As compared with the method for manufacturing the conventional HSG storage electrode which has a small process margin due to the fact that specific conditions are required, and has limitations in increasing cell capacitance, the capacitor according to the present invention requires no specific process conditions and has its increased capacitance while the physical properties of the material itself are used. Further, the method of the present invention is more simplified and easily extends the effective area of the cell capacitor. Further, it is also possible that the method referred in the present invention is applied to various capacitors, for example, a stacked-trench type capacitor, a trench capacitor, and a stacked capacitor such as a cylindrical capacitor, a Box structured capacitor, a hollow capacitor and a pin structured capacitor.

It is to be understood that further modifications and alterations may be made without departing from the spirit and scope of the present invention.

What is claimed is:

1. A method for manufacturing a highly integrated semiconductor device having a capacitor of large capacitance comprising the steps of:

forming a first electrode by forming a conductive layer on a semiconductor substrate, forming an insulating layer including pin holes on said conductive layer, forming an etching mask via said pin holes by an oxidation process, removing said insulating layer, etching said conductive layer, and defining said conductive layer into cell units; and forming a dielectric film and a second electrode on said first electrode.

2. A method for manufacturing a highly integrated semiconductor device as claimed in claim 1, wherein said etching mask is constituted by silicon oxide islands.

3. A method for manufacturing a highly integrated semiconductor device as claimed in claim 1, wherein conductive layer is etching by anisotropic etching.

4. A method for manufacturing a highly integrated semiconductor device as claimed in claim 1, wherein said insulating layer is a silicon nitride layer.

5. A method for manufacturing a semiconductor as claimed in claim 4, wherein said silicon nitride layer is formed by depositing silicon nitride by the LPCVD method to a thickness of about 30 Å–500 Å.

6. A method for manufacturing a semiconductor as claimed in claim 1, wherein said etching mask is formed by exposing said conductive layer on which a insulating layer including pin holes is formed under an oxidative atmosphere and oxidizing the surface portion of said conductive layer.

7. A method for manufacturing a semiconductor as claimed in claim 1, further comprising the step of removing said etching mask after etching said conductive layer.

8. A method for manufacturing a semiconductor as claimed in claim 7, said etching mask is removed by wet etching.

9. A method for manufacturing a semiconductor as claimed in claim 1, further comprising the step of coating a conductive material on said conductive layer after etching said conductive layer or on said first electrode after defining said conductive layer into cell units to form said first electrode.

10. A method for manufacturing a semiconductor as claimed in claim 9, wherein said conductive material is an impurity-implanted polycrystalline silicon.

11. A method for manufacturing a semiconductor as claimed in claim 10, wherein said conductive material is coated by depositing polycrystalline silicon via CVD method and then implantating an impurity.

12. A method for manufacturing a semiconductor as claimed in claim 9, said conductive material is coated by depositing in a thickness of 50 Å–500 Å.

13. A method for manufacturing a semiconductor as claimed in claim 1, wherein said conductive layer is composed of polycrystalline silicon implanted with an impurity.

14. A method for manufacturing a semiconductor as claimed in claim 13, wherein said conductive layer is a polycrystalline silicon layer formed by depositing a polycrystalline silicon on a semiconductor substrate and then implanting an impurity.

15. A method for manufacturing a semiconductor as claimed in claim 1, said conductive layer is formed on the inner surface of a trench formed in a silicon substrate.

16. A method for manufacturing a semiconductor as claimed in claim 1, wherein said conductive layer is defined into cell units by forming a photoresist pattern on said conductive layer and anistropically etching said conductive layer.

17. A method for manufacturing a semiconductor as claimed in claim 1, wherein said capacitor is a stacked capacitor, or a stacked trench capacitor.

18. A method for manufacturing a highly integrated semiconductor device having a capacitor of large capacitance comprising the steps of:
forming a first electrode by forming a conductive structure on a semiconductor substrate, forming an insulating layer including pin holes on said conductive structure, forming an etching mask via said pin holes by an oxidation process, removing said insulating layer, and etching said conductive structure; and
forming a dielectric film and a second electrode on said first electrode.

19. A method for manufacturing a highly integrated semiconductor device as claimed in claim 18, wherein said etching mask comprises silicon oxide islands.

20. A method for manufacturing a highly integrated semiconductor device as claimed in claim 18, wherein said conductive structure is etched by isotropic etching.

21. A method for manufacturing a highly integrated semiconductor device as claimed in claim 18, wherein said insulating layer is a silicon nitride layer.

22. A method for manufacturing a highly integrated semiconductor as claimed in claim 21, wherein said silicon nitride layer is formed by depositing silicon nitride by the LPCVD method to a thickness of about 30 Å–500 Å.

23. A method for manufacturing a highly integrated semiconductor device as claimed in claim 18, wherein said etching mask is formed by exposing the conductive structure on which an insulating layer including pin holes is formed under an oxidative atmosphere and then oxidizing the surface portion of the conductive structure.

24. A method for manufacturing a highly integrated semiconductor device as claimed in claim 18, further comprising the step of removing said etching mask after etching said conductive structure.

25. A method for manufacturing a highly integrated semiconductor device as claimed in claim 24, said etching mask is removed by wet-etching.

26. A method for manufacturing a highly integrated semiconductor device as claimed in claim 18, further comprising the step of coating a conductive material on said conductive structure after etching said conductive structure.

27. A method for manufacturing a highly integrated semiconductor device as claimed in claim 26, wherein said conductive material is an impurity-implanted polycrystalline silicon.

28. A method for manufacturing a highly integrated semiconductor device as claimed in claim 27, wherein said conductive material is coated by depositing polycrystalline silicon via a CVD method and then implantating an impurity.

29. A method for manufacturing a highly integrated semiconductor device as claimed in claim 26, said conductive material is coated by depositing in a thickness of 50 Å–500 Å.

30. A method for manufacturing a highly integrated semiconductor device as claimed in claim 18, wherein said conductive structure is composed of polycrystalline silicon or a single crystalline silicon implanted with an impurity.

31. A method for manufacturing a highly integrated semiconductor device as claimed in claim 30, wherein said conductive structure is a polycrystalline silicon pattern formed by depositing polycrystalline silicon on a semiconductor substrate, implanting an impurity and then patterning via an ordinary lithography process.

32. A method for manufacturing a highly integrated semiconductor device as claimed in claim 30, said conductive structure is formed on the inner surface of a trench formed in a silicon substrate.

33. A method for manufacturing a highly integrated semiconductor device as claimed in claim 30, wherein said conductive structure is the inner surface portion of a trench formed in said semiconductor substrate.

34. A method for manufacturing a highly integrated semiconductor device as claimed in claim 18, wherein said capacitor is a stacked capacitor, a trench capacitor, a stacked-trench capacitor, a cylindrical capacitor, a pin structured capacitor, a hollow capacitor or a Box-structured capacitor.

* * * * *